(12) United States Patent
Matsuzawa

(10) Patent No.: US 11,218,114 B2
(45) Date of Patent: Jan. 4, 2022

(54) VIBRATOR DEVICE, AND ELECTRONIC DEVICE

(71) Applicant: SEIKO EPSON CORPORATION, Tokyo (JP)

(72) Inventor: Yusuke Matsuzawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 155 days.

(21) Appl. No.: 16/554,262

(22) Filed: Aug. 28, 2019

(65) Prior Publication Data
US 2020/0076367 A1    Mar. 5, 2020

(30) Foreign Application Priority Data

Aug. 29, 2018 (JP) .............................. JP2018-160744

(51) Int. Cl.
| | |
|---|---|
| *H03B 5/36* | (2006.01) |
| *H03H 9/05* | (2006.01) |
| *H03H 9/10* | (2006.01) |
| *H03H 9/19* | (2006.01) |
| *H03H 3/02* | (2006.01) |
| *B06B 1/04* | (2006.01) |

(52) U.S. Cl.
CPC .................. *H03B 5/36* (2013.01); *H03H 3/02* (2013.01); *H03H 9/0519* (2013.01); *H03H 9/0547* (2013.01); *H03H 9/10* (2013.01); *H03H 9/1021* (2013.01); *H03H 9/19* (2013.01); *B06B 1/045* (2013.01)

(58) Field of Classification Search
CPC ...... H04H 9/0519; H04H 9/1021; H03H 3/02; H03H 9/10; H03H 9/19; H03H 9/0547; B60B 1/0648; B60B 1/045; H03B 5/36
USPC ....................... 331/158, 68, 116 FE; 310/333
See application file for complete search history.

(56) References Cited

U.S. PATENT DOCUMENTS 8,860,516 B2 * 10/2014 Nishio ...................... H03B 1/02
                                                      331/107 A

FOREIGN PATENT DOCUMENTS

| JP | H02-261210 | 10/1990 |
| JP | 2004-128591 | 4/2004 |
| JP | 2007-129326 | 5/2007 |

* cited by examiner

*Primary Examiner* — Arnold M Kinkead
(74) *Attorney, Agent, or Firm* — Workman Nydegger

(57) ABSTRACT

A vibrator device includes a semiconductor substrate, a vibrator unit, a cover, and an insulating film. The vibrator unit is disposed at a first surface of the semiconductor substrate, and includes a vibrator element, and an excitation electrode disposed at the vibrator element and having a portion facing the semiconductor substrate. The cover is bonded to the first surface in a joint portion surrounding the vibrator unit. The insulating film is disposed at the first surface. The insulating film overlaps the portion of the excitation electrode in plan view, and is absent at the joint portion of the semiconductor substrate and the cover.

6 Claims, 13 Drawing Sheets

VIBRATOR DEVICE, AND ELECTRONIC DEVICE

The present application is based on, and claims priority from JP Application Serial Number 2018-160744, filed Aug. 29, 2018, the disclosure of which is hereby incorporated by reference herein in its entirety.

BACKGROUND

1. Technical Field

The present disclosure relates to a vibrator device, a method of production thereof, and an electronic device.

2. Related Art

JP-A-2-261210 describes an oscillator that includes a piezoelectric vibrator directly mounted on a semiconductor integrated part, and a cover disposed over the piezoelectric vibrator from above the semiconductor integrated part. JP-A-2007-129326 describes a piezoelectric vibrator that includes: a sealed container formed of a base member and a cover member that are bonded to each other via a metal film; a piezoelectric vibrator element housed inside the sealed container; an electrode portion that applies a voltage to the piezoelectric vibrator; an extraction electrode electrically connected to the electrode portion, and disposed past the joint portion between the base member and the cover member; and an insulating film disposed between the extraction electrode and the metal film.

However, the oscillator of JP-A-2-261210 does not take any measure against the possible shorting between the electrode disposed on the semiconductor integrated part and the extraction electrode of the piezoelectric vibrator. The piezoelectric vibrator of JP-A-2007-129326 also fails to take any measure against the possible shorting between the electrode portion and the excitation electrode of the piezoelectric vibrator element.

SUMMARY

An application example of the present disclosure is directed to a vibrator device that includes:
  a semiconductor substrate;
  a vibrator unit mounted at one principal surface side of the semiconductor substrate; and
  a cover bonded in a portion surrounding the vibrator unit at the one principal surface side of the semiconductor substrate,
  the vibrator unit including a vibrator element, and an excitation electrode disposed at the vibrator element,
  the excitation electrode being partly disposed at a semiconductor substrate side of the vibrator element,
  the vibrator device including an insulating film disposed at the one principal surface side of the semiconductor substrate,
  the insulating film being disposed over a portion of the excitation electrode in plan view, and being absent at the joint portion of the semiconductor substrate and the cover.

In the application example, the semiconductor substrate and the cover may be both made of a silicon material.

In the application example, the semiconductor substrate may have a circuit electrically coupled to the vibrator unit.

In the application example, the insulating film may have a portion exposed outside of the vibrator unit in a plan view from the vibrator unit side, and the exposed portion may have a contour that lies between the vibrator unit and the joint portion.

In the application example, the contour of the exposed portion may lie along a contour of the vibrator unit.

Another application example of the present disclosure is directed to an electronic device that includes the vibrator device of the application example of the present disclosure.

Another application example of the present disclosure is directed to a method for producing a vibrator device, the method including:
  disposing an insulating film at one principal surface side of a semiconductor substrate;
  preparing a vibrator unit that includes a vibrator element, and an excitation electrode disposed at the vibrator element, and mounting the vibrator unit at the one principal side of the semiconductor substrate with a portion of the excitation electrode facing the semiconductor substrate side; and
  bonding a cover to the semiconductor substrate in a portion surrounding the vibrator unit at the one principal surface side of the semiconductor substrate,
  the insulating film being disposed over the portion of the excitation electrode in plan view, and being absent at the joint portion of the semiconductor substrate and the cover.

DESCRIPTION OF EXEMPLARY EMBODIMENTS

The following describes a vibrator device, a vibrator device producing method, and an electronic device based on embodiments represented by the accompanying drawings.

First Embodiment

Figure 1:
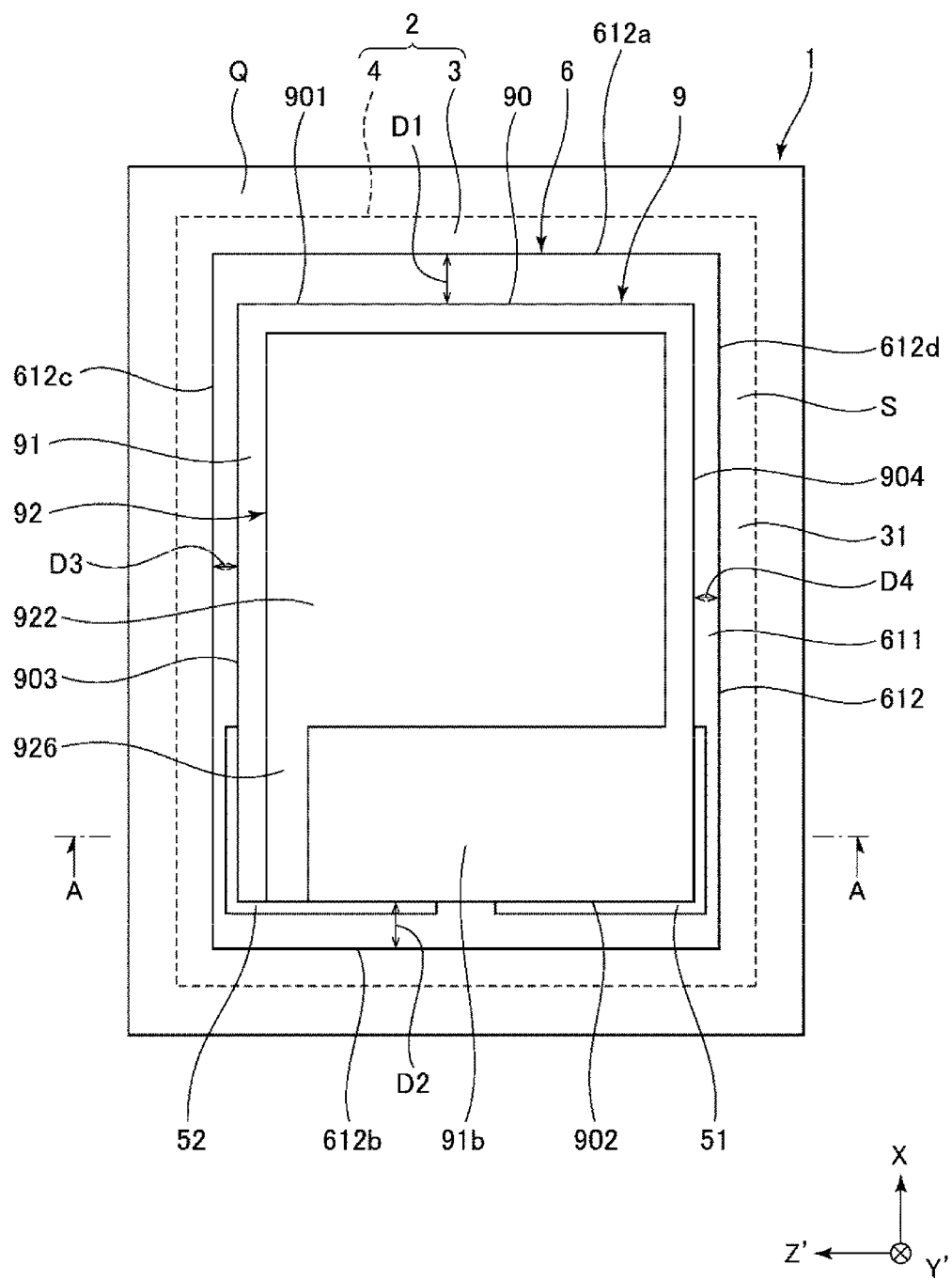
FIG. 1 is a plan view representing a vibrator device according to First Embodiment.
Figure 2:
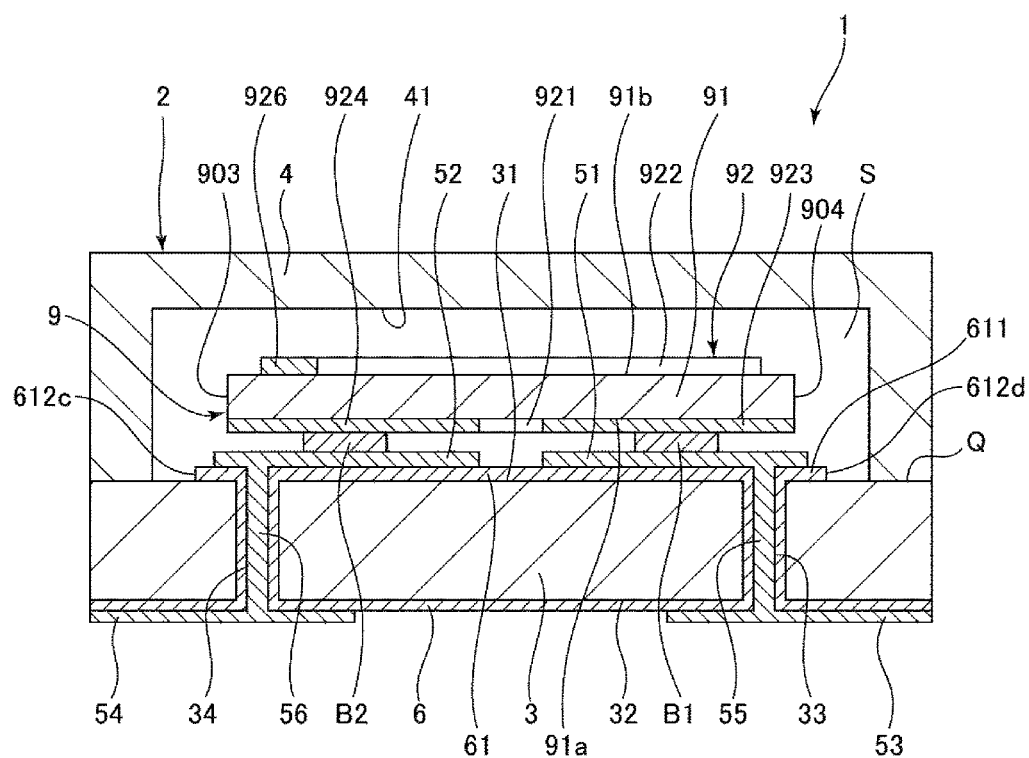
FIG. 2 is a cross sectional view at line A-A of FIG. 1.
Figure 2:
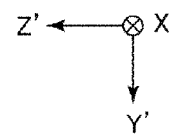
Figure 3:
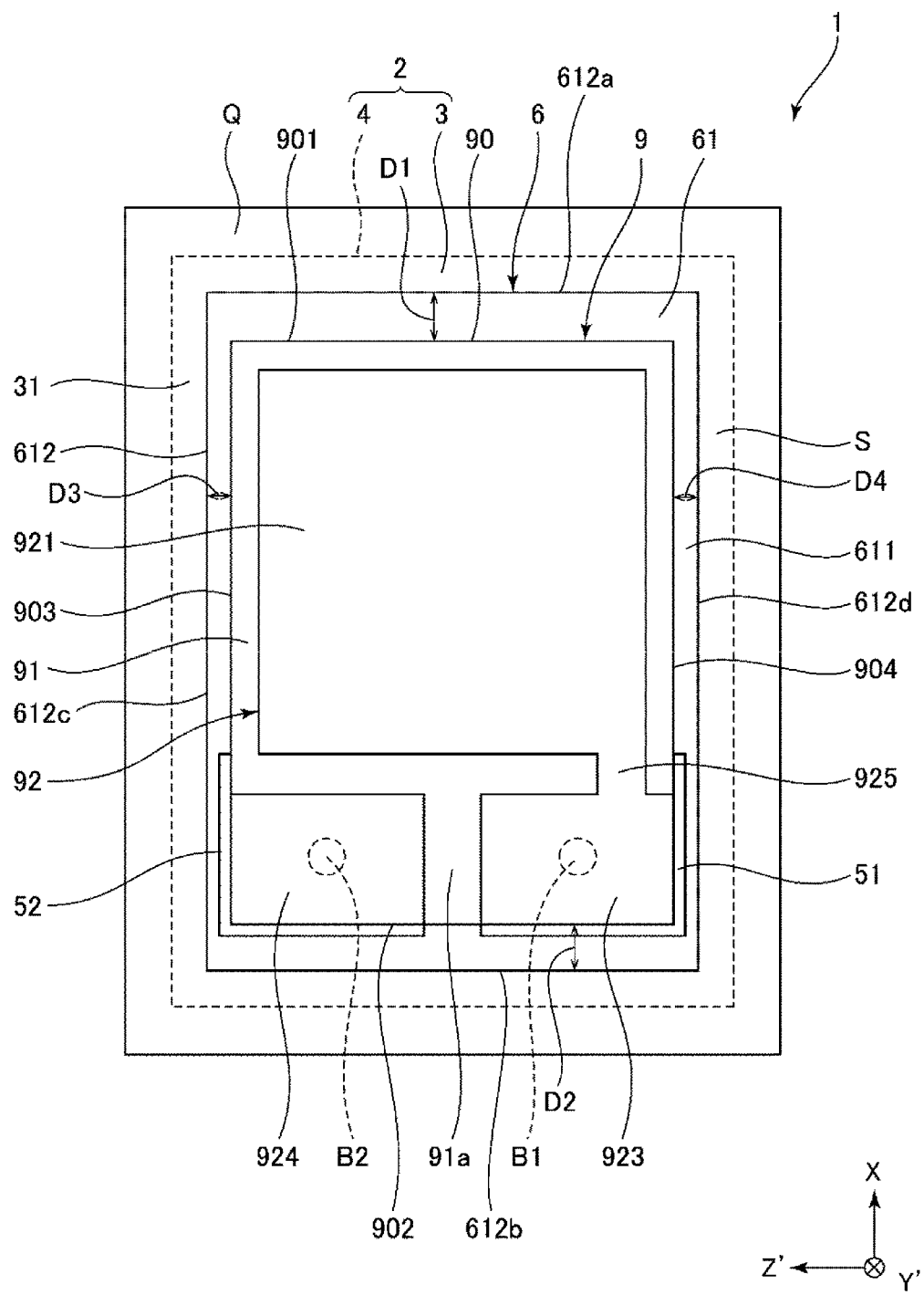
FIG. 3 is a transparent plan view representing the bottom surface of the vibrator unit as viewed from the top surface side.
Figure 4:
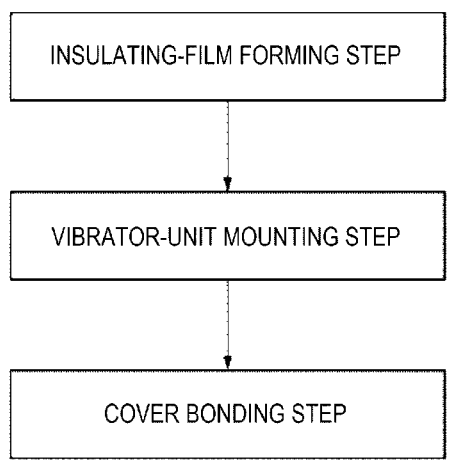
FIG. 4 is a diagram representing manufacturing steps of the vibrator device.

FIG. 1 is a plan view illustrating a vibrator device according to First Embodiment. FIG. 2 is a cross sectional view at line A-A of FIG. 1. FIG. 3 is a transparent plan view of the bottom surface of the vibrator unit as viewed from the top surface side. FIG. 4 is a diagram representing manufacturing steps of the vibrator device. FIGS. 5 through 16 are cross sectional views describing a method for producing the vibrator device. In the following, for convenience of explanation, the term "top" is used to refer to the side out of the plane of the paper in FIGS. 1 and 3, and the upper side of FIG. 2 and FIGS. 5 to 16, and the term "bottom" is used to refer to the side into the plane of the paper in FIGS. 1 and 3, and the lower side of FIG. 2 and FIGS. 5 to 16, where appropriate. With regard to the crystal axis of a quartz crystal, descriptions will be given through the case where the X axis, Y axis, and Z axis represent the electrical axis, the mechanical axis, and the optical axis, respectively.

As illustrated in FIG. 1, a vibrator device 1 includes a package 2, and a vibrator unit 9 housed inside the package 2.

Package

The package 2 includes a semiconductor substrate 3, and a cover 4 bonded to the semiconductor substrate 3. With the semiconductor substrate 3 and the cover 4 bonded to each other, an air-tight storage space S is created in the package 2. The atmosphere in the storage space S is not particularly limited. In the present embodiment, the storage space S is in a reduced pressure state, preferably a vacuum. With a reduced pressured state in the storage space S, the vibrator unit 9 can have improved oscillation efficiency.

The cover 4 has an open bottom surface, forming a recessed portion 41. The cover 4 is bonded to the top surface 31 of the semiconductor substrate 3 with the vibrator unit 9 housed in the recessed portion 41. Specifically, the cover 4 is bonded to the semiconductor substrate 3 in a portion surrounding the vibrator unit 9 at the top surface 31 side of the semiconductor substrate 3. (Here, the top surface 31 represents one of the principal surfaces.) The semiconductor substrate 3 and the cover 4 are both configured from a monocrystalline silicon substrate, and are directly bonded to each other. Here, "direct bonding" means particularly activation bonding at ordinary temperature. Ordinary-temperature activation bonding is a bonding technique whereby the bonding faces of the semiconductor substrate 3 and the cover 4 are activated by irradiation of an ion beam, and the semiconductor substrate 3 and the cover 4 are bonded to each other under applied pressure after mating the activated bonding faces of the semiconductor substrate 3 and the cover 4. This bonding technique forms the bond at room temperature, without heat treatment or annealing, and produces less heat strain in the package 2. The package 2 also can be reduced in height because the technique does not involve interposition of an additional material, for example, such as an adhesive. There is also no risk of generating an out-gas, and the storage space S can remain in a reduced pressure state.

The method of bonding the semiconductor substrate 3 and the cover 4 is not limited to direct bonding, and these may be bonded to each other via, for example, an adhesive or a metal bonding film. The semiconductor substrate 3 is not particularly limited, and a semiconductor substrate configured from, for example, germanium, zinc selenide, cadmium sulfide, zinc oxide, gallium arsenide, indium phosphide, gallium nitride, or silicon carbide also maybe used. The cover 4 is not particularly limited either, and, for example, a semiconductor substrate other than silicon substrates may be used. It is also possible to use, for example, a metal substrate configured from various metallic materials, or a glass substrate configured from various glass materials. The metallic materials may be alloys.

Preferably, the semiconductor substrate 3 and the cover 4 are both p-type (positive-type) substrates or n-type (negative-type) substrates. With the semiconductor substrate 3 and the cover 4 being both p-type or n-type, there is no formation of a pn junction region between the semiconductor substrate 3 and the cover 4, and the semiconductor substrate 3 and the cover 4 can be brought to the same potential with ease. For example, the shield effect can be obtained by bringing the semiconductor substrate 3 and the cover 4 to a fixed potential (e.g., GND), and the influence of disturbance can be reduced. However, the semiconductor substrate 3 and the cover 4 are not limited to this, and may be semiconductors of different charge types.

As illustrated in FIG. 2, the semiconductor substrate 3 has a pair of through holes 33 and 34 that penetrates through the semiconductor substrate 3 along the thickness direction. An insulating film 6 is disposed at the top surface 31 and bottom surface 32 of the semiconductor substrate 3, and at the inner peripheral surfaces of the through holes 33 and 34. The insulating film 6 will be described later in greater detail.

As illustrated in FIG. 2, a pair of inner electrodes 51 and 52 is disposed at the top surface 31 of the semiconductor substrate 3, via the insulating film 6. A pair of outer electrodes 53 and 54 is disposed at the bottom surface 32 of the semiconductor substrate 3, via the insulating film 6. Inside the through holes 33 and 34 are formed through electrodes 55 and 56. The inner electrode 51 and the outer electrode 53 are electrically coupled to each other with the through electrode 55. The inner electrode 52 and the outer electrode 54 are electrically coupled with each other with the through electrode 56.

Vibrator Unit

As illustrated in FIGS. 1 and 3, the vibrator unit 9 includes a vibrator element 91, which is plate-like and rectangular in shape when viewed in plan, and an electrode 92 disposed at the vibrator element 91. The vibrator element 91 is a quartz crystal blank that undergoes a thickness slip vibration. In the present embodiment, the vibrator element 91 is a quartz crystal blank cut at the AT cut angle. The AT cut is a type of crystal cut that produces a principal surface after cutting the x-z plane of the quartz crystal at about 35°15' counterclockwise from the Z-crystal axis about the x-crystal axis. The principal surface is a plane that includes the X and Z' axes, and the normal line is along the Y' axis. In the following, for convenient of explanation, the positive side of the X axis will be referred to also as "tip end" or "tip-end side", and the negative side of the X axis will be referred to also as "base end" or "base-end side".

The electrode 92 includes: an excitation electrode 921 disposed more toward the tip-end side of the bottom surface 91a (one of the principal surfaces) of the vibrator element 91; an excitation electrode 922 disposed more toward the tip-end side of the top surface 91b (the other principal surface) of the vibrator element 91 and opposite the excitation electrode 921; interconnection electrodes 923 and 924 disposed side by side along the Z' axis at a base portion of the bottom surface 91a of the vibrator element 91; a lead wire 925 that electrically couples the excitation electrode 921 and the interconnection electrode 923 to each other; and a lead wire 926 that electrically couples the excitation electrode 922 and the interconnection electrode 924 to each other.

As illustrated in FIG. 2, the vibrator unit 9 is housed inside the storage space S with the bottom surface 91a facing the semiconductor substrate 3 side. The vibrator unit 9 is fixed to the semiconductor substrate 3 via a pair of metal bumps B1 and B2 representing a fixing member. The metal bump B1 is in contact with the inner electrode 51 and the interconnection electrode 923, fixing the vibrator unit 9 to the semiconductor substrate 3, and electrically coupling the inner electrode 51 and the interconnection electrode 923 to each other. The metal bump B2 is in contact with the inner electrode 52 and the interconnection electrode 924, fixing the vibrator unit 9 to the semiconductor substrate 3, and electrically coupling the inner electrode 52 and the interconnection electrode 924 to each other.

The metal bumps B1 and B2 are not particularly limited, and may be, for example, gold bumps, silver bumps, copper bumps, aluminum bumps, or solder bumps. The fixing member is not limited to the metal bumps B1 and B2, and may be, for example, a conductive adhesive. It is, however, preferable from the viewpoint of preventing generation of an out-gas to use the metal bumps B1 and B2 as in the present embodiment.

Though the vibrator unit 9 has been described above, the vibrator unit 9 is not limited to the configuration represented in the figures. For example, the vibrator element 91, which is plate-like in shape in the vibrator unit 9 of the present embodiment, may be, for example, a "mesa-type" with a protruding vibrating portion, or an "inverted mesa-type" with a depressed vibrating portion. The vibrator element 91 may be a BT-cut element, instead of the AT-cut element. The vibrator unit 9, which is a thickness slip-type vibrator unit in the present embodiment, may be an in-plane flexural vibration-type vibrator unit having two vibrating arms that vibrate by repeatedly moving closer to and farther away from each other.

The vibrator element 91 is not limited to a quartz crystal, and may use piezoelectric materials other than quartz crystals. Examples of such piezoelectric materials include lithium niobate, lithium tantalate, lead zirconate titanate, lithium tetraborate, langasite, potassium niobate, gallium phosphate, gallium arsenate, aluminum nitride, zinc oxide, barium titanate, lead titanate, sodium potassium niobate, bismuth ferrite, sodium niobate, bismuth titanate, and sodium bismuth titanate. The vibrator element 91 may use materials other than piezoelectric materials. An example of such a non-piezoelectric material is silicon. When using materials other than piezoelectric materials, for example, the vibrator element 91 may be configured so that, with the piezoelectric device, the vibrator element 91 can vibrate in response to the expansion and contraction of the piezoelectric device effected by passing current.

Insulating Film

The insulating film 6 is described below. As mentioned above with reference to FIG. 2, the insulating film 6 is disposed at the surfaces of the semiconductor substrate 3, specifically, at the top surface 31 and bottom surface 32 of the semiconductor substrate 3, and at the inner peripheral surfaces of the through holes 33 and 34. The inner electrodes 51 and 52, the outer electrodes 53 and 54, and the through electrodes 55 and 56 are disposed at the semiconductor substrate 3 via the insulating film 6. With the insulating film 6 formed at the surfaces of the semiconductor substrate 3, it is possible to effectively reduce shorting between two groups of electrodes via the semiconductor substrate 3, specifically, between a group of electrodes including the inner electrode 51, the outer electrode 53, and the through electrode 55, and a group of electrodes including the inner electrode 52, the outer electrode 54, and the through electrode 56.

The insulating film 6 is configured from silicon oxide ($SiO_2$). In this way, the insulating film 6 can have a sufficiently high resistance value. The semiconductor substrate 3 is configured from silicon, as mentioned above. This makes it possible to easily form the insulating film 6 by, for example, thermally oxidizing the surfaces of the semiconductor substrate 3. The material forming the insulating film 6 is not particularly limited, and may be, for example, silicon nitride (SiN). The method of forming the insulating film 6 is not limited to thermal oxidation, and the insulating film 6 may be formed by using a method, for example, such as CVD or sputtering.

The following more specifically describes the insulating film 6 by focusing on the insulating film disposed at the top surface 31 side of the semiconductor substrate 3. In the following, for convenience of explanation, the insulating film disposed at the top surface 31 side of the semiconductor substrate 3 will be referred to also as "insulating film 61". As illustrated in FIG. 3, the insulating film 61 is disposed over the excitation electrode 921 of the vibrator unit 9 in plan view. Here, "insulating film 61 being disposed over the excitation electrode 921" means that the insulating film 61 is overlapping at least a part of the excitation electrode 921, preferably the whole region of the excitation electrode 921. With the insulating film 61 disposed in this fashion, it is possible to prevent the excitation electrode 921 and the semiconductor substrate 3 from contacting each other, and to effectively reduce shorting between the semiconductor substrate 3 and the excitation electrode 921.

The vibrator unit 9 is fixed to the semiconductor substrate 3 via the metal bumps B1 and B2 at the base-end side, and, accordingly, the tip-end side becomes the free end. The free-end side is more likely to contact the semiconductor substrate 3 because of the tilt that occurs during the vibration or when fixing the vibrator unit 9. When disposing the insulating film 6 over a part of the excitation electrode 921, it is therefore preferable that the insulating film 6 be disposed over the tip end portion of the excitation electrode 921, that is, the portion having the highest chance of contacting the semiconductor substrate 3. In this way, the foregoing effect can be effectively exerted.

The insulating film 61 is not disposed at the joint portion Q of the semiconductor substrate 3 and the cover 4. With the absence of the insulating film 6 between the semiconductor substrate 3 and the cover 4, the semiconductor substrate 3 and the cover 4 can be bonded to each other by direct bonding, as described above. The package 2 also can be reduced in height because of the absence of the insulating film 6 between the semiconductor substrate 3 and the cover 4.

The insulating film 61 has an exposed portion 611 exposed outside of the vibrator unit 9 as viewed in plan from the vibrator unit 9 side. The exposed portion 611 has a contour lying between the vibrator unit 9 and the joint portion Q. With the contour 612 of the exposed portion 611 lying between the vibrator unit 9 and the joint portion Q, the excitation electrode 921 and the semiconductor substrate 3 can be more reliably prevented from contacting each other, and the insulating film 61 can be prevented from interfering with the direct bonding of the semiconductor substrate 3 and the cover 4. In the present embodiment, the exposed portion 611 is exposed outside of the vibrator unit 9 all around the vibrator unit 9. However, the present disclosure is not limited to this, and the exposed portion 611 may be exposed outside of the vibrator unit 9 at at least a part of the perimeter of the vibrator unit 9, or the exposed portion 611 may not be provided.

To describe more specifically, in the present embodiment, the contour 612 of the exposed portion 611 is along the contour 90 of the vibrator unit 9 in a plan view of the insulating film 6. Specifically, the contour 90 of the vibrator unit 9 includes a first vibrator-element contour 901 situated at the tip-end side and extending along the Z' axis, a second vibrator-element contour 902 situated at the base-end side and extending along the Z' axis, a third vibrator-element contour 903 extending along the X axis and connecting the end portions of the first vibrator-element contour 901 and the second vibrator-element contour 902 to each other at the positive side of the Z' axis, and a fourth vibrator-element contour 904 extending along the X axis and connecting the end portions of the first vibrator-element contour 901 and the second vibrator-element contour 902 at the negative side of the Z' axis.

On the other hand, the contour 612 of the exposed portion 611 includes a first insulating-film contour 612a situated at the tip-end side of the first vibrator-element contour 901 and parallel to the first vibrator-element contour 901, a second insulating-film contour 612b situated at the base-end side of the second vibrator-element contour 902 and parallel to the second vibrator-element contour 902, a third insulating-film contour 612c situated at the positive side of the third vibrator-element contour 903 relative to the Z' axis and parallel to the third vibrator-element contour 903, and a fourth insulating-film contour 612d situated at the negative side of the fourth vibrator-element contour 904 relative to the Z' axis and parallel to the fourth vibrator-element contour 904. Here, "parallel" is inclusive of the contour being tilted within at most 5 degree angle relative to the other, corresponding contour.

With such a configuration, the contour 612 of the exposed portion 611 is substantially similar in shape to the contour 90 of the vibrator unit 9, and the insulating film 6 can be used as a marker when fixing the vibrator unit 9 to the semiconductor substrate 3. This enables the vibrator unit 9 to be accurately disposed against the semiconductor substrate 3.

Here, provided that the vibrator unit 9 is disposed at the designed ideal position, that is, when there is no misalignment in the position of the vibrator unit 9, it is preferable that the separation distance D1 between the first vibrator-element contour 901 and the first insulating-film contour 612a be equal to the separation distance D2 between the second vibrator-element contour 902 and the second insulating-film contour 612b, and that the separation distance D3 between the third vibrator-element contour 903 and the third insulating-film contour 612c be equal to the separation distance D4 between the fourth vibrator-element contour 904 and the fourth insulating-film contour 612d. By locating the vibrator unit 9 in a position where the separation distance D1 and the separation distance D2 are equal to each other, a misalignment along the X axis can be reduced. Likewise, a misalignment along the Z' axis can be reduced by locating the vibrator unit 9 in a position where the separation distance D3 and the separation distance D4 are equal to each other. As used herein, "separation distances D1 and D2 being equal to each other" means that, aside from being exactly the same, D1 and D2 are the same with an error of, for example, about ±5%. Similarly, "separation distances D3 and D4 being equal to each other" means that, aside from being exactly the same, D3 and D4 are the same with an error of, for example, about ±5%.

The vibrator device 1 is as described above. The vibrator device 1 includes the semiconductor substrate 3, the vibrator unit 9 mounted at the top surface 31 side of the semiconductor substrate 3, and the cover 4 bonded to the semiconductor substrate 3 in a portion surrounding the vibrator unit 9 at the top surface 31 side of the semiconductor substrate 3. The vibrator unit 9 includes the vibrator element 91, and the excitation electrodes 921 and 922 disposed at the vibrator element 91. With regard to the excitation electrodes 921 and 922, the excitation electrode 921 as a part of the excitation electrodes is disposed at the semiconductor substrate 3 side. The insulating film 61 is disposed at the top surface 31 side of the semiconductor substrate 3. The insulating film 61 is disposed over the excitation electrode 921 in plan view, and is not disposed at the joint portion Q of the semiconductor substrate 3 and the cover 4. With such a configuration, the insulating film 61 can effectively reduce shorting due to the excitation electrode 921 and the semiconductor substrate 3 contacting each other. The insulating film 61 also can be prevented from interfering with the bonding of the semiconductor substrate 3 and the cover 4, particularly when these are directly bonded to each other.

As described above, the semiconductor substrate 3 and the cover 4 are both made of a silicon material. Accordingly, the semiconductor substrate 3 and the cover 4 can be bonded to each other by direct bonding. This makes it possible to strengthen the bond between the semiconductor substrate 3 and the cover 4. Because the bonding of the semiconductor substrate 3 and the cover 4 can be made at ordinary temperature, the package 2 formed by the semiconductor substrate 3 and the cover 4 becomes less susceptible to heat strain.

As described above, the insulating film 61 has the exposed portion 611, which is a portion exposed outside of the vibrator unit 9 when viewed in plan from the vibrator unit 9 side. The contour 612 of the exposed portion 611 lies between the vibrator unit 9 and the joint portion Q. In this way, the insulating film 61 can more effectively reduce shorting due to the excitation electrode 921 and the semiconductor substrate 3 contacting each other. The insulating film 61 also can be more effectively prevented from interfering with the direct bonding of the semiconductor substrate 3 and the cover 4.

As described above, the contour 612 of the exposed portion 611 is along the contour 90 of the vibrator unit 9. This makes it easier to locate the vibrator unit 9 against the semiconductor substrate 3.

The following describes a method for producing the vibrator device 1. As shown in FIG. 4, a method for producing the vibrator device 1 includes an insulating-film forming step of forming the insulating film 6 at the semiconductor substrate 3, a vibrator-unit mounting step of mounting the vibrator unit at the semiconductor substrate 3, and a cover bonding step of bonding the cover 4 to the semiconductor substrate 3. These steps are described below in detail, in the order listed.

Insulating-Film Forming Step

Figure 5:
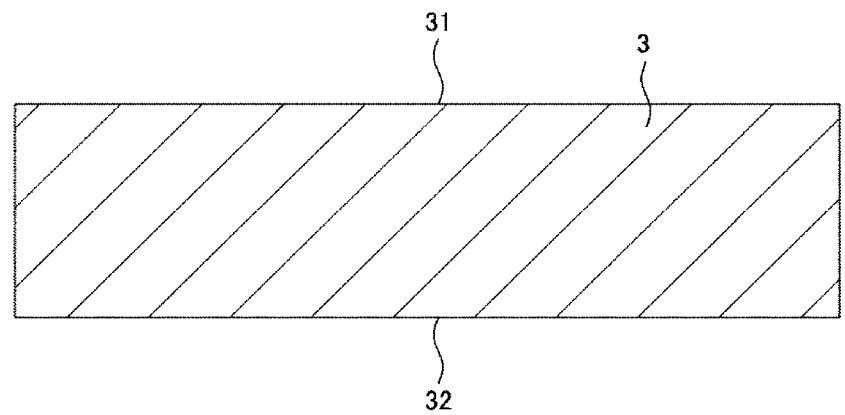
FIG. 5 is a cross sectional view describing a method for producing the vibrator device.
Figure 6:
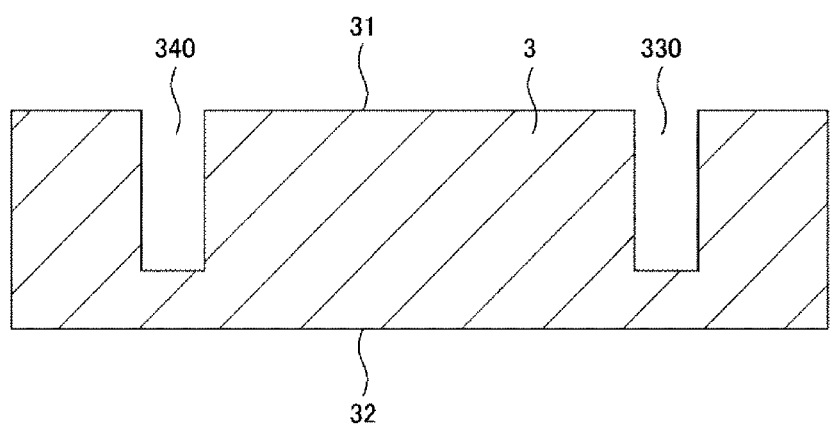
FIG. 6 is a cross sectional view describing a method for producing the vibrator device.

First, the semiconductor substrate 3 formed of a silicon substrate is prepared, as shown in FIG. 5. The semiconductor substrate 3 prepared is thicker than the semiconductor substrate 3 in the final product. This is to improve handling. Thereafter, as shown in FIG. 6, closed-end holes 330 and 340 are formed in the top surface 31 of the semiconductor substrate 3 by, for example, dry etching, specifically, the Bosch process. The method used to form the holes 330 and 340 is not particularly limited, and the holes 330 and 340 may be formed by, for example, wet etching.

Figure 7:
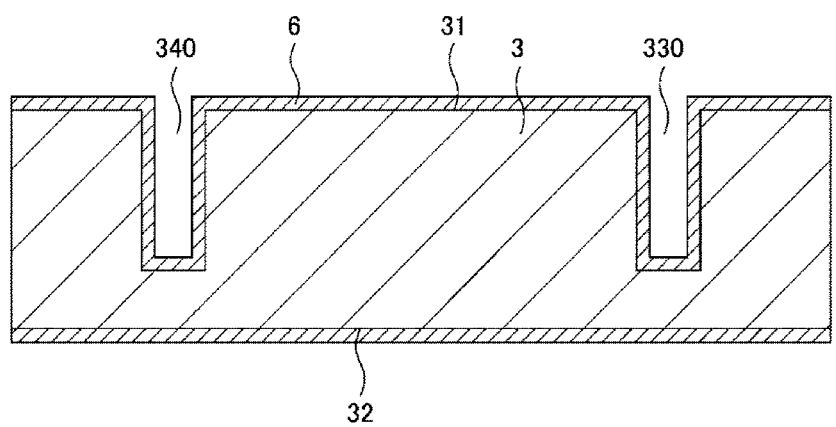
FIG. 7 is a cross sectional view describing a method for producing the vibrator device.
Figure 8:
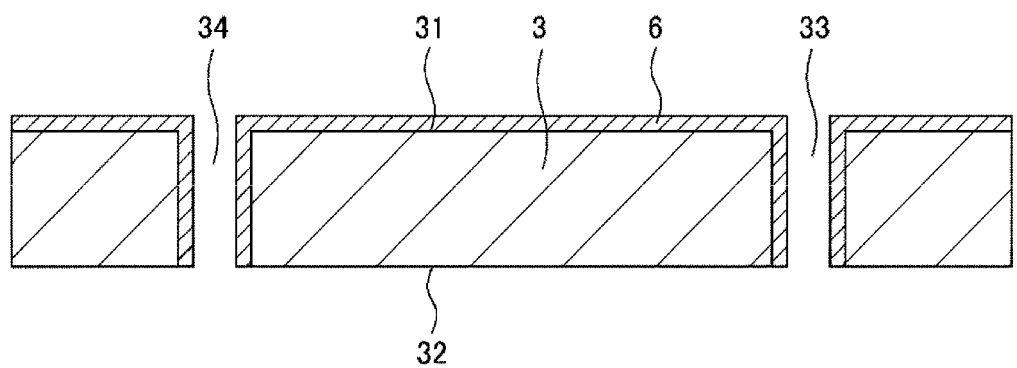
FIG. 8 is a cross sectional view describing a method for producing the vibrator device.
Figure 9:
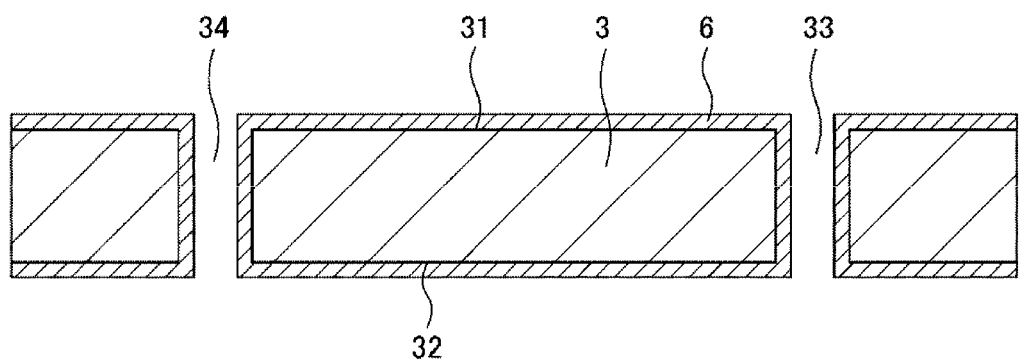
FIG. 9 is a cross sectional view describing a method for producing the vibrator device.

Thereafter, as shown in FIG. 7, the semiconductor substrate 3 is thermally oxidized to form the insulating film 6 of silicon oxide at a surface of the semiconductor substrate 3. As shown in FIG. 8, the semiconductor substrate 3 is then ground and polished from the bottom surface 32 side until the semiconductor substrate 3 becomes thin enough to expose the holes 330 and 340. The holes 330 and 340 become the through holes 33 and 34 after this process. The grinding and polishing method is not particularly limited, and may be, for example, a combination of back grinding, CMP (chemical mechanical polishing), and dry polishing. Thereafter, as shown in FIG. 9, the semiconductor substrate 3 is subjected to thermal oxidation again to form the insulating film 6 of silicon oxide at the bottom surface of the semiconductor substrate 3.

Figure 10:
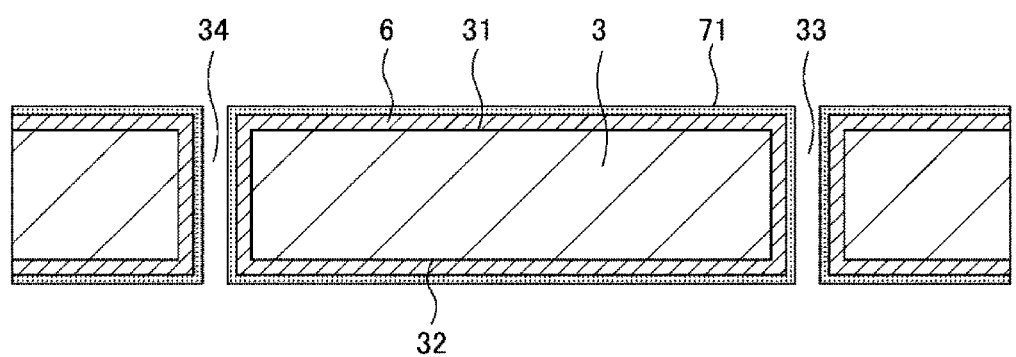
FIG. 10 is a cross sectional view describing a method for producing the vibrator device.
Figure 11:
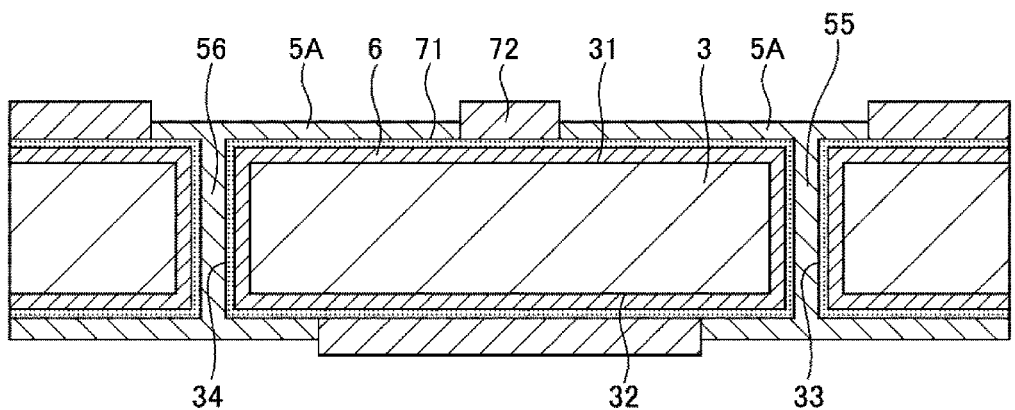
FIG. 11 is a cross sectional view describing a method for producing the vibrator device.
Figure 12:
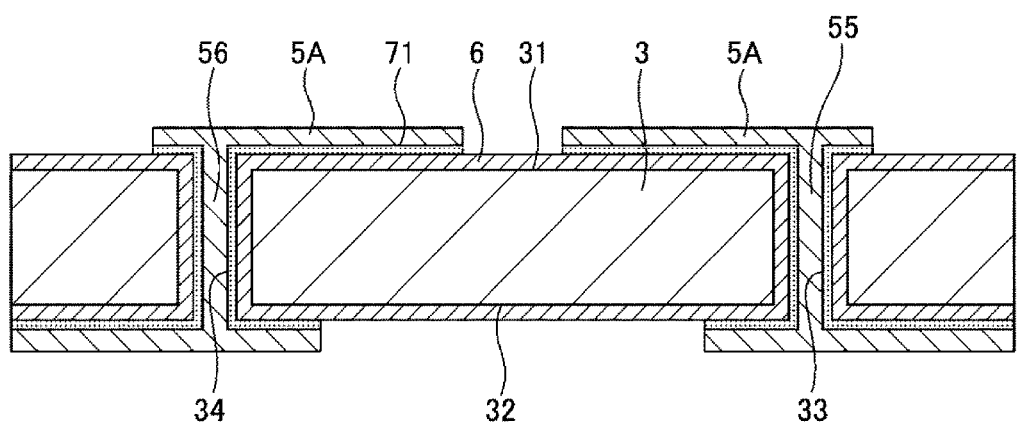
FIG. 12 is a cross sectional view describing a method for producing the vibrator device.
Figure 13:
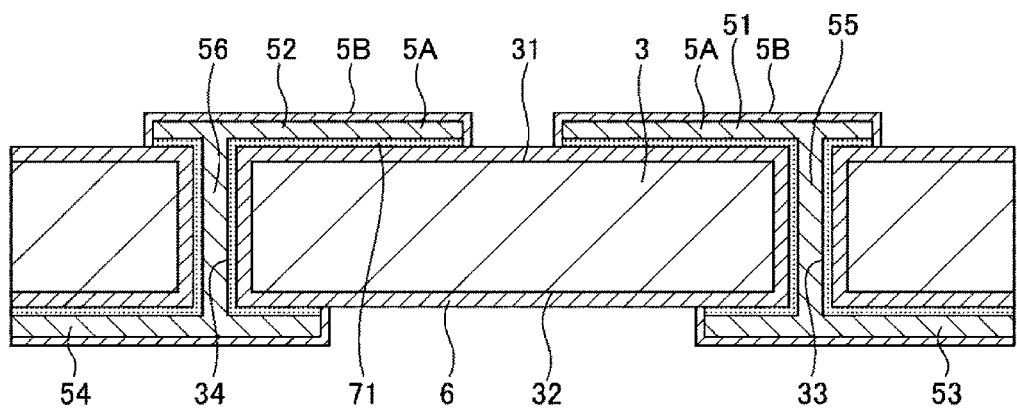
FIG. 13 is a cross sectional view describing a method for producing the vibrator device.

This is followed by formation of a seed layer 71 at the surfaces of the insulating film 6, as shown in FIG. 10. The seed layer 71 is not particularly limited, and may be, for example, a laminate of a TiW layer and a Cu layer. The seed layer 71 may be deposited by, for example, CVD or sputtering. Thereafter, as shown in FIG. 11, a resist layer 72 having apertures corresponding in position to the inner electrodes 51 and 52 and the outer electrodes 53 and 54 is formed at surfaces of the seed layer 71, and a Cu plating 5A is formed in portions of the seed layer 71 exposed from the resist layer 72. Here, the Cu plating 5A forms the through electrodes 55 and 56 as it fills the through holes 33 and 34. After removing the resist layer 72, the portions of the seed layer 71 exposed from the Cu plating 5A are removed, as shown in FIG. 12. This is followed by formation of a metal film 5B on the Cu plating 5A by non-electrolytic plating, as shown in FIG. 13. This forms the inner electrodes 51 and 52 and the outer electrodes 53 and 54. The metal film 5B is not particularly limited, and may be, for example, a laminate of a Ni layer, a Pd layer, and a Au layer.

Figure 14:
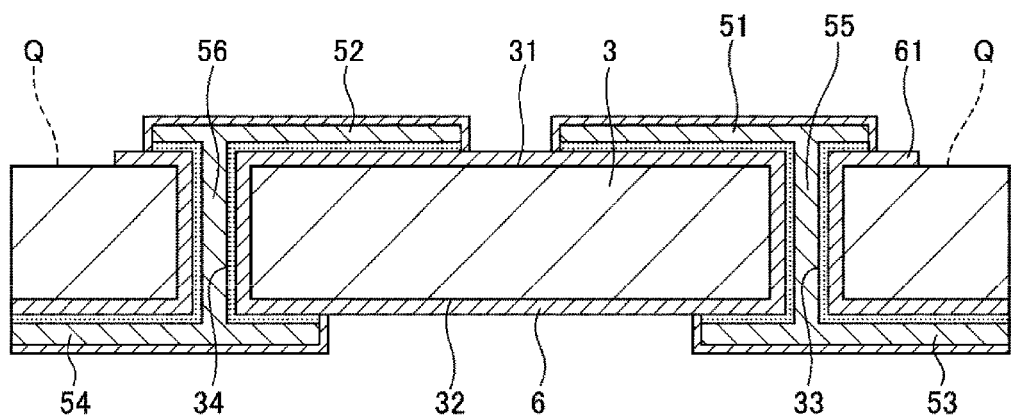
FIG. 14 is a cross sectional view describing a method for producing the vibrator device.

Thereafter, as shown in FIG. 14, the insulating film 6 at the top surface 31 of the semiconductor substrate 3 is patterned to form the insulating film 61. The insulating film 6 may be patterned by using, for example, a photolithography technique and an etching technique. As described above, the insulating film 6 is patterned in such a manner that, when the vibrator unit 9 is disposed as designed, the insulating film 61 after patterning has the exposed portion 611 that is exposed outside of the vibrator unit 9 in plan view, and the contour 612 of the exposed portion 611 is along the contour 90 of the vibrator unit 9. The insulating film 61 is patterned so that the insulating film 61 after patterning is absent at the joint portion Q of the semiconductor substrate 3 and cover 4 in the subsequent cover bonding step.

Vibrator-Unit Mounting Step

Figure 15:
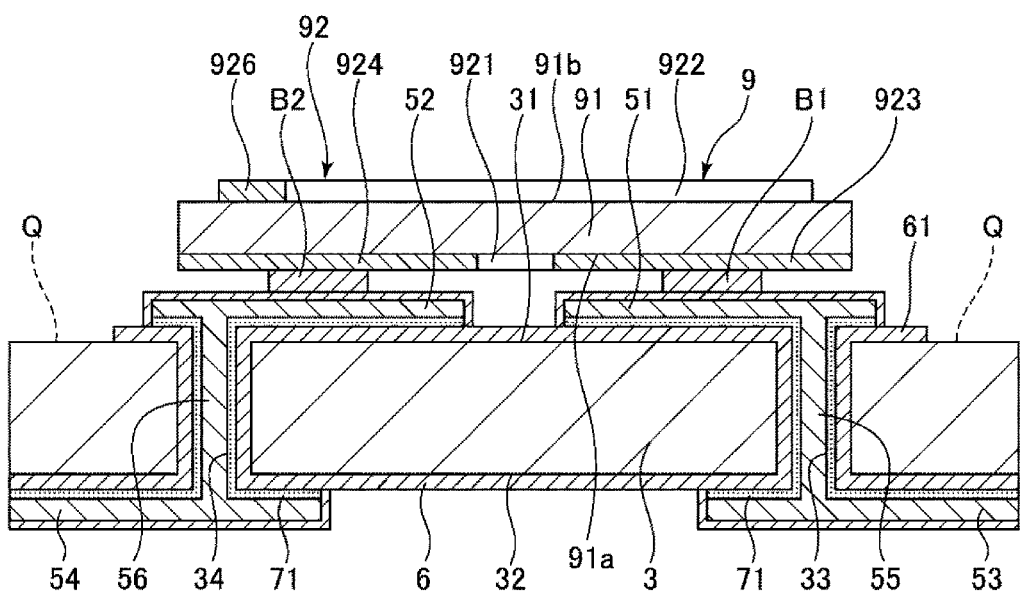
FIG. 15 is a cross sectional view describing a method for producing the vibrator device.

The vibrator unit 9 is prepared that includes the electrode 92 at a surface of the vibrator element 91. The vibrator unit 9 is fixed at the top surface side of the semiconductor substrate 3 via the metal bumps B1 and B2, as shown in FIG. 15. Here, the vibrator unit 9 can be located with ease at a predetermined position by aligning the contour 90 of the vibrator unit 9 along the contour 612 of the insulating film 61. The insulating film 61 reduces shorting due to the excitation electrode 921 of the vibrator unit 9 contacting the semiconductor substrate 3.

Cover Bonding Step

Figure 16:
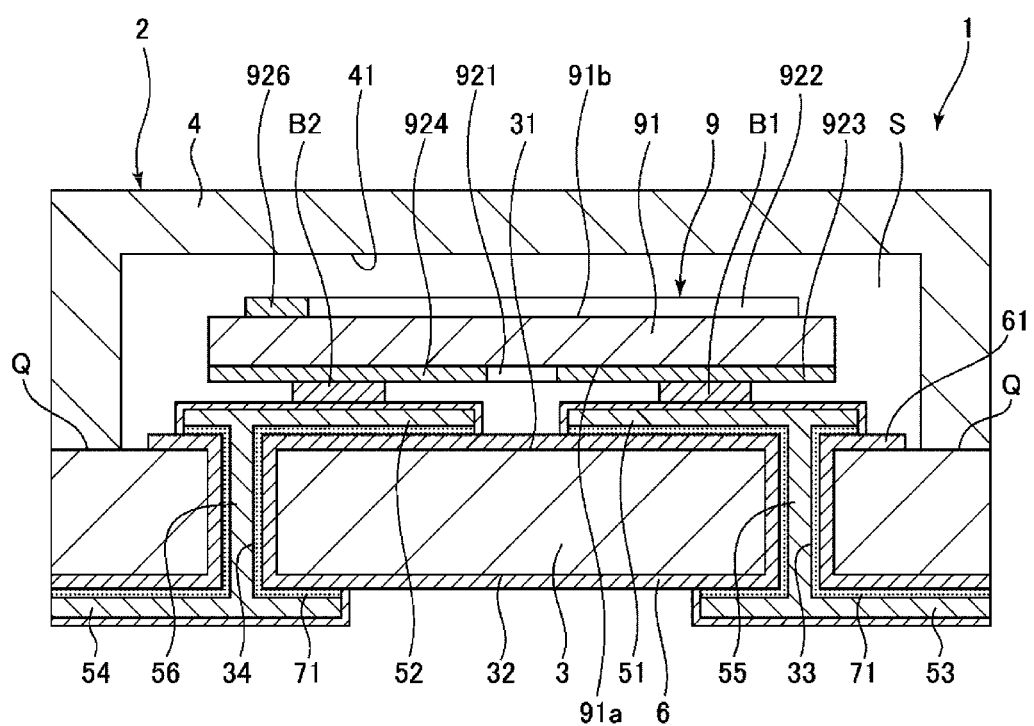
FIG. 16 is a cross sectional view describing a method for producing the vibrator device.

The cover 4 configured from a silicon substrate is prepared. As shown in FIG. 16, the cover 4 is bonded to the top surface of the semiconductor substrate 3 to form the package 2 that houses the vibrator unit 9. The bonding method is not particularly limited. In the present embodiment, the cover 4 and the semiconductor substrate 3 are bonded to each other by direct bonding, particularly ordinary-temperature bonding. In this way, the semiconductor substrate 3 and the cover 4 can be strongly bonded to each other. Because the bonding does not use an additional material such as an adhesive or a bonding layer, the package 2 can be reduced in height, and generation of an out-gas can be reduced.

The vibrator device 1 is obtained after these steps. As described above, a method for producing the vibrator device 1 includes: disposing the insulating film 61 at the top surface side of the semiconductor substrate 3; preparing the vibrator unit 9 that includes the vibrator element 91 and the excitation electrodes 921 and 922 disposed at the vibrator element 91, and mounting the vibrator unit 9 at the top surface 31 side of the semiconductor substrate 3 with the excitation electrode 921 facing the semiconductor substrate 3 side as a part of the excitation electrodes; and bonding the cover 4 to the semiconductor substrate 3 in a portion surrounding the vibrator unit 9 at the top surface 31 side of the semiconductor substrate 3. The insulating film 61 is disposed over the excitation electrode 921 in plan view, and is not disposed at the joint portion Q of the semiconductor substrate 3 and the cover 4. With the method of production above, the insulating film 61 can effectively reduce shorting due to the excitation electrode 921 and the semiconductor substrate 3 contacting each other. The insulating film 61 is also prevented from interfering with the bonding of the semiconductor substrate and the cover 4, particularly when the semiconductor substrate 3 and the cover 4 are directly bonded to each other.

Second Embodiment

Figure 17:
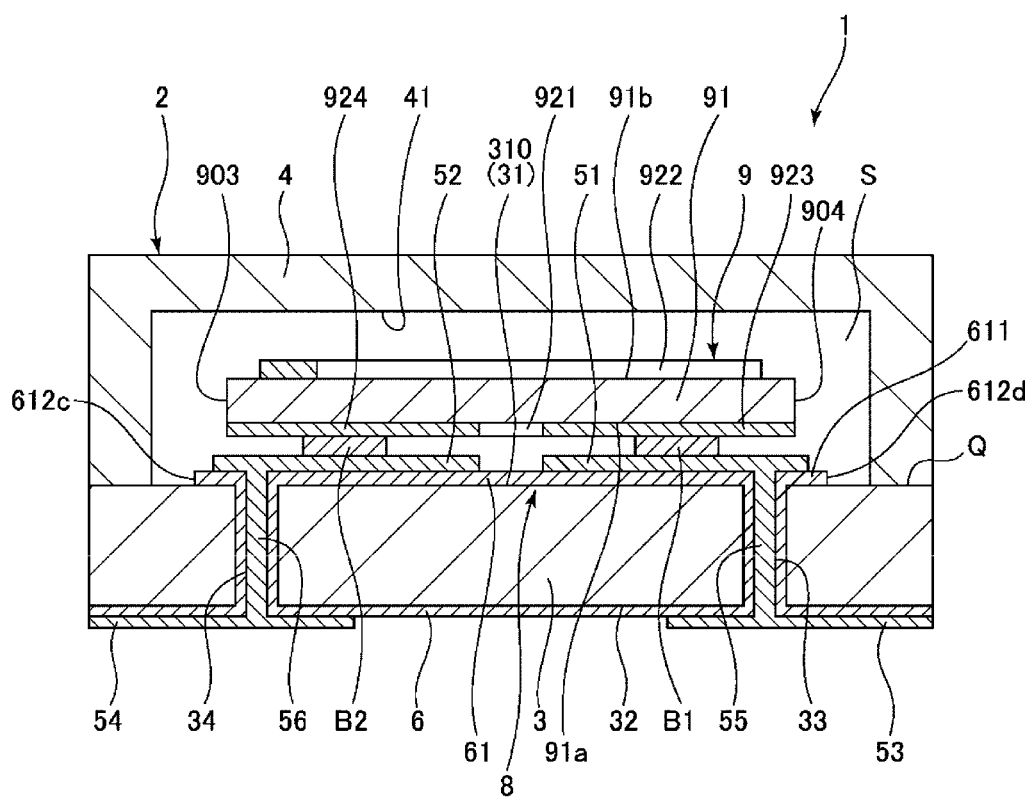
FIG. 17 is a cross sectional view representing a vibrator device according to Second Embodiment.
Figure 17:
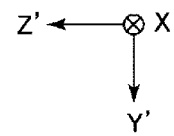

FIG. 17 is a cross sectional view representing a vibrator device according to Second Embodiment.

A vibrator device 1 according to the present embodiment is the same as the vibrator device 1 described in First Embodiment, except that a circuit is formed at the semiconductor substrate 3. The following descriptions of the vibrator device 1 of Second Embodiment focus on differences from the foregoing First Embodiment, and the same features described in First Embodiment will not be described. In FIG. 17, the same reference numerals are used to refer to the same components described in First Embodiment.

As illustrated in FIG. 17, in the vibrator device 1 of the present embodiment, the top surface 31 of the semiconductor substrate 3 represents an active surface 310, and a circuit 8 is formed at the active surface 310. The circuit 8 is an electrical circuit (not illustrated) for driving the vibrator unit 9, and includes, for example, a thermosensor that detects the ambient temperature, a temperature compensating circuit storing temperature compensation data for compensating the temperature characteristics of the vibrator unit 9, and that corrects the vibration characteristics of the vibrator unit 9 according to temperature changes, using the temperature compensation data, and an oscillation circuit coupled to the temperature compensating circuit, and that generates a predetermined oscillation output, among others. The oscillation output generated by the oscillation circuit is used as a reference signal, for example, such as a clock signal. That is, the vibrator device 1 of the present embodiment is used as an oscillator.

In the present embodiment, the top surface 31 of the semiconductor substrate 3 represents the active surface 310, and, consequently, difficulties may arise in forming the insulating film 61 by thermal oxidation as in First Embodiment. In such cases, for example, the insulating film 61 may be formed by CVD or sputtering over the circuit 8.

As described above, in the vibrator device 1 of the present embodiment, the circuit 8 electrically coupled to the vibrator unit 9 is formed at the semiconductor substrate 3. The vibrator device 1 can thus be used as, for example, an oscillator, as mentioned above.

The same effects described in First Embodiment can be obtained also in Second Embodiment. The present embodiment has been described through the case of the top surface 31 of the semiconductor substrate 3 representing the active surface. However, the present disclosure is not limited to this, and the active surface may be the bottom surface 32 of the semiconductor substrate 3.

Third Embodiment

Figure 18:
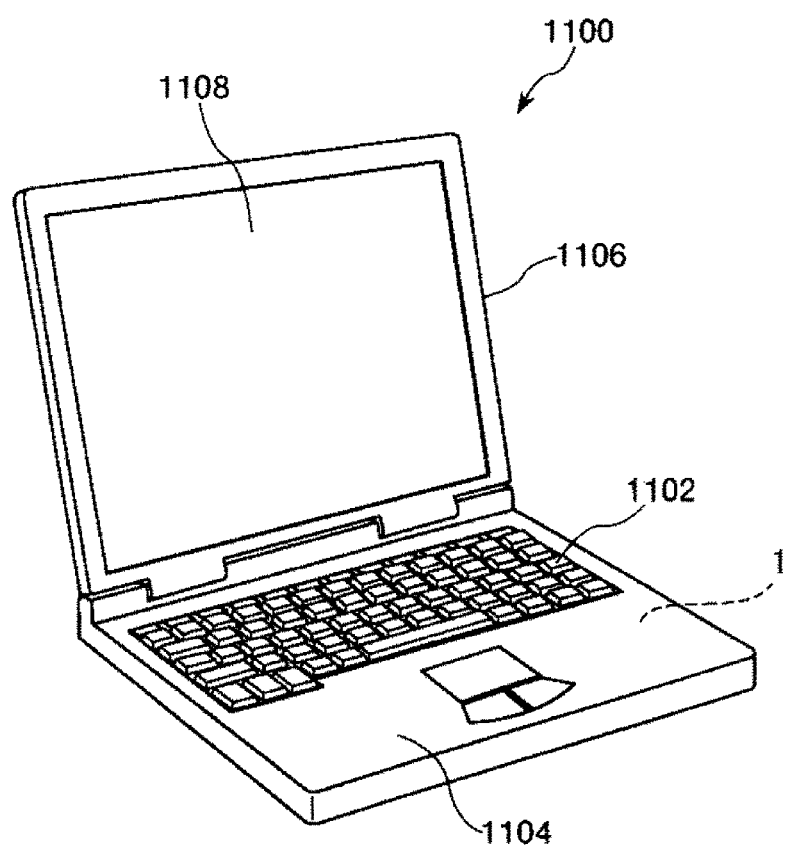
FIG. 18 is a perspective view representing an electronic device according to Third Embodiment.

FIG. 18 is a perspective view representing an electronic device according to Third Embodiment.

FIG. 18 shows a mobile personal computer 1100 as an example of an electronic device. The personal computer 1100 is configured from a body 1104 having a keyboard 1102, and a display unit 1106 having a display 1108. The display unit 1106 is pivotally supported by the body 1104 at a hinge structure section. The personal computer 1100 is installed with the vibrator device 1. The vibrator device 1 may be used as, for example, an oscillator.

As described above, the personal computer 1100 as an electronic device includes the vibrator device 1. The personal computer 1100 can thus benefit from the effects of the vibrator device 1, and can exhibit high reliability.

Fourth Embodiment

Figure 19:
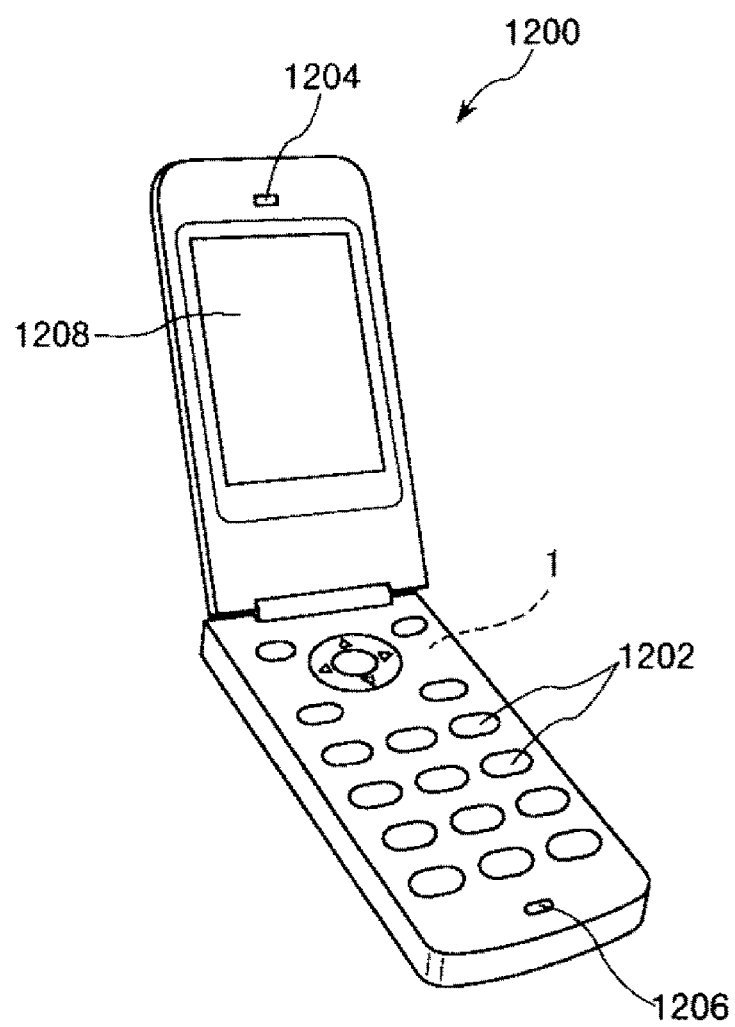
FIG. 19 is a perspective view representing an electronic device according to Fourth Embodiment.

FIG. 19 is a perspective view representing an electronic device according to Fourth Embodiment.

FIG. 19 shows a mobile phone 1200 as an example of an electronic device. The mobile phone 1200 includes an antenna (not illustrated), a plurality of key pads 1202, a speaker 1204, a microphone 1206, and a display 1208 disposed between the key pads 1202 and the speaker 1204. The mobile phone 1200 is installed with the vibrator device 1. The vibrator device 1 may be used as, for example, an oscillator.

As described above, the mobile phone 1200 as an electronic device includes the vibrator device 1. The mobile phone 1200 can thus benefit from the effects of the vibrator device 1, and can exhibit high reliability.

Fifth Embodiment

Figure 20:
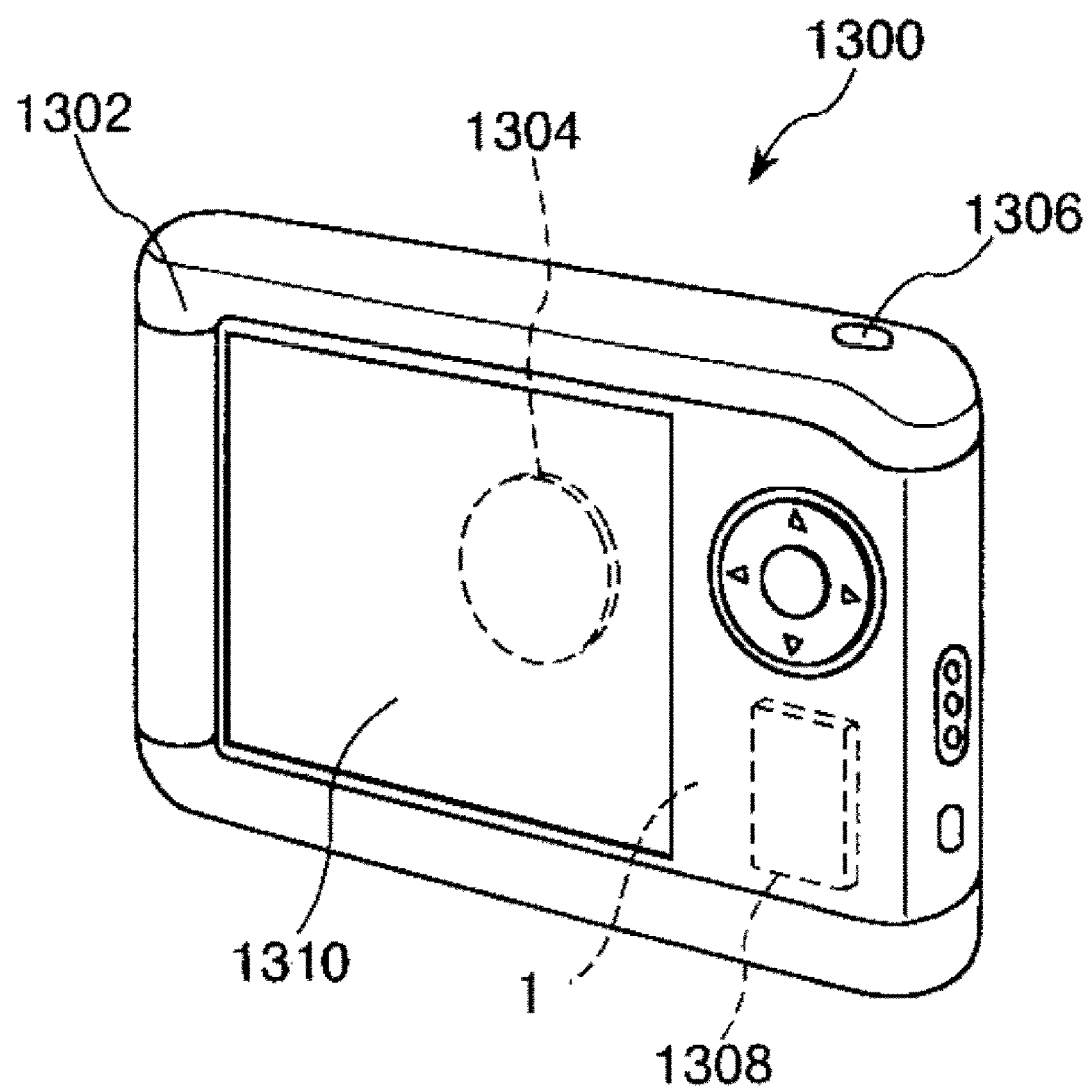
FIG. 20 is a perspective view representing an electronic device according to Fifth Embodiment.

FIG. 20 is a perspective view representing an electronic device according to Fifth Embodiment.

FIG. 20 shows an digital still camera 1300 as an example of an electronic device. The camera 1300 is configured to include a display 1310 at the back face of a case 1302, and displays an image based on an image signal from a CCD (Charge Coupled Device). The display 1310 functions as a finder by displaying an electronic image of a subject. On the front side of the case 1302 is provided a light-receiving unit 1304 that includes, for example, an optical lens and a CCD. A CCD image signal is transferred and stored in memory 1308 upon a user pressing a shutter button 1306 after checking the subject's image displayed in the display 1310. The digital still camera 1300 is installed with a vibrator device 1. The vibrator device 1 may be used as, for example, an oscillator.

As described above, the digital still camera 1300 as an electronic device includes the vibrator device 1. The digital still camera 1300 can thus benefit from the effects of the vibrator device 1, and can exhibit high reliability.

Examples of electronic devices other than personal computers, mobile phones, and digital still cameras such as those described above include smartphones, tablet devices, timepieces, smart watches, inkjet ejection devices (such as inkjet printers), laptop personal computers, televisions, wearable devices (such as head-mounted displays, or HMDs for short), video cameras, video cassette recorders, car navigations, pagers, electronic organizers, electronic dictionaries, calculators, computer gaming machines, word processors, workstations, video phones, security television monitors, electronic binoculars, POS (Point Of Sales) terminals, medical equipment, fishfinders, various measurement instruments, equipment for mobile-terminal base stations, instruments, flight simulators, and network servers. Examples of the medical equipment include electronic thermometers, blood pressure meters, blood glucose meters, electrocardiogram meters, ultrasound diagnostic devices, and electronic endoscopes. Examples of the instruments include instruments for vehicles, aircraft, and ships.

The foregoing embodiments described the vibrator device, the vibrator device producing method, and the electronic devices with reference to the accompanying drawings. However, the present disclosure is not limited to these, and the configuration of each component may be replaced with an arbitrary configuration having the same or similar functions. Addition of an arbitrary component to the present disclosure is also possible. The present disclosure may be a combination of two or more arbitrarily selected configurations of the different embodiments.

Second Embodiment described a configuration based on the vibrator device used as an oscillator. However, the present disclosure is not limited to this, and, for example, the vibrator device also may be applied to a physical quantity sensor configured to detect physical quantities, for example, such as acceleration and angular velocity. In this case, the vibrator unit 9 may be configured to include a drive vibration mode, and a detection vibration mode in which excitation occurs according to the received physical quantity, and the circuit 8 may be configured to include a drive circuit for driving the vibrator unit 9 in drive vibration mode, and a detection circuit for detecting a physical quantity based on a signal from the detection vibration mode of the vibrator unit 9.

What is claimed is:

1. A vibrator device comprising:
   a semiconductor substrate;
   a vibrator unit disposed at a first surface of the semiconductor substrate and including
   a vibrator element, and
   an excitation electrode disposed at the vibrator element and having a portion facing the semiconductor substrate;

a cover bonded to the first surface of the semiconductor substrate in a joint portion surrounding the vibrator unit; and an insulating film disposed at the first surface and at a second surface of the semiconductor substrate and being disposed at an inner peripheral surface of a through hole that extends through the substrate from the first surface to the second surface, the insulating film overlapping the portion of the excitation electrode in plan view, and being absent at the joint portion of the semiconductor substrate and the cover.

2. The vibrator device according to claim 1, wherein the semiconductor substrate and the cover are both made of a silicon material.

3. The vibrator device according to claim 1, wherein the semiconductor substrate includes a circuit electrically coupled to the vibrator unit.

4. The vibrator device according to claim 1, wherein the insulating film has a contour lying between the vibrator unit and the joint portion in plan view.

5. The vibrator device according to claim 4, wherein the contour of the insulating film lies along a contour of the vibrator unit.

6. An electronic device comprising the vibrator device of claim 1.

* * * * *